United States Patent [19]

Kim et al.

[11] Patent Number: 5,552,329
[45] Date of Patent: Sep. 3, 1996

[54] METHOD OF MAKING METAL OXIDE SEMICONDUCTOR TRANSISTORS

[75] Inventors: Kyung S. Kim; Jun H. Lim, both of Seoul, Rep. of Korea

[73] Assignee: LG Semicon Co., Ltd., Tokyo, Japan

[21] Appl. No.: 472,593

[22] Filed: Jun. 6, 1995

Related U.S. Application Data

[62] Division of Ser. No. 180,784, Jan. 5, 1994, abandoned.

[51] Int. Cl.⁶ ..................... H01L 21/266; H01L 21/8234
[52] U.S. Cl. ............................ 437/29; 437/44; 437/203; 437/968
[58] Field of Search ................................. 437/44, 41 CS, 437/968, 29, 203

[56] References Cited

U.S. PATENT DOCUMENTS

| | | |
|---|---|---|
| 4,597,824 | 7/1986 | Shinada et al. . |
| 5,082,794 | 1/1992 | Pfiester et al. .................. 437/40 |
| 5,175,119 | 12/1992 | Matsutani . |
| 5,218,221 | 6/1993 | Okumura . |
| 5,270,257 | 12/1993 | Shin ................................. 437/203 |
| 5,342,796 | 8/1994 | Ahn et al. ......................... 437/41 |
| 5,376,570 | 12/1994 | Jung et al. ......................... 437/41 |
| 5,399,508 | 3/1995 | Nowak ............................ 437/27 |
| 5,448,094 | 9/1995 | Hsu .................................. 257/330 |

FOREIGN PATENT DOCUMENTS

| | | |
|---|---|---|
| 2-1173A | 1/1990 | Japan . |
| 2-110973A | 4/1990 | Japan . |

*Primary Examiner*—Mary Wilczewski
*Assistant Examiner*—Richard A. Booth
*Attorney, Agent, or Firm*—Morgan, Lewis and Bockius LLP

[57] ABSTRACT

A method of fabricating a metal oxide semiconductor transistor comprising:

a silicon substrate having a first conductivity type in which its central portion having a channel region has a recessed surface and other portion excepting the central portion has a flattened surface, a thin gate oxide film formed on the recessed surface of the silicon substrate, an oxide film formed on the flattened of the silicon substrate and having a thickness a little thicker than that of the gate oxide film, a gate formed on the gate oxide film and having a structure in which its upper surface is flattened and its lower surface is convex, a thick cap oxide film on the gate, a low concentration source region and drain region having a second conductivity type overlapped completely with the gate and formed on a portion adjacent to the channel region of the recessed surface of the silicon substrate, a high concentration source region and drain region having the second conductivity type formed on the flattened surface of the silicon substrate and adjacent to the low concentration of source and drain region; and impurity regions formed on the silicon substrate such that they enclose the low concentration source region and drain region.

7 Claims, 12 Drawing Sheets

F I G.5f
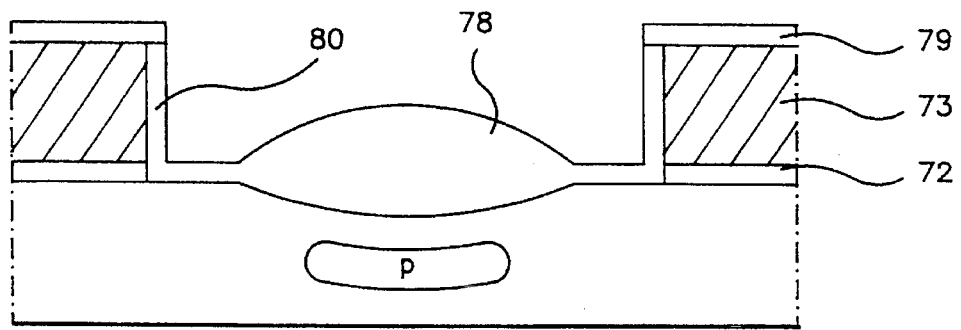
F I G.5g
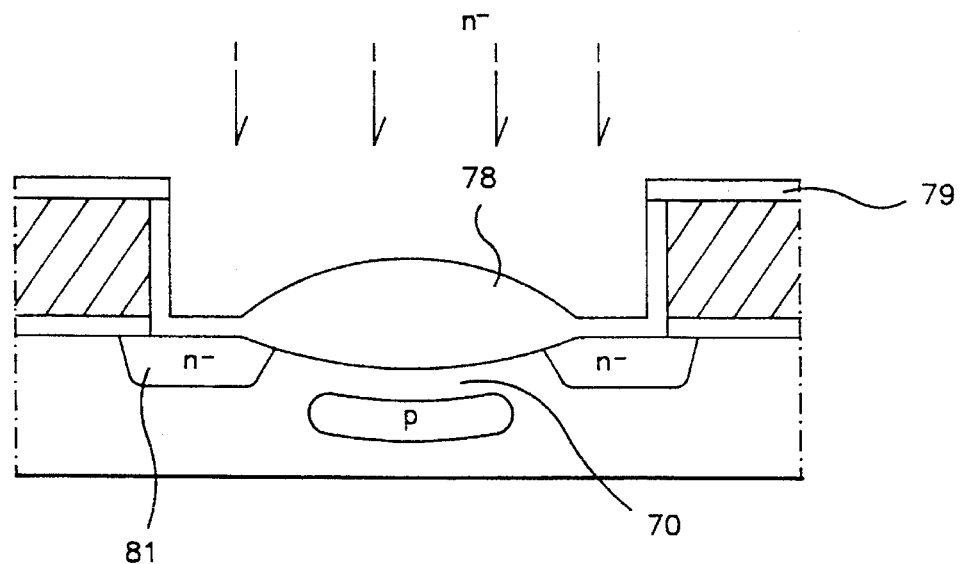
F I G.5h
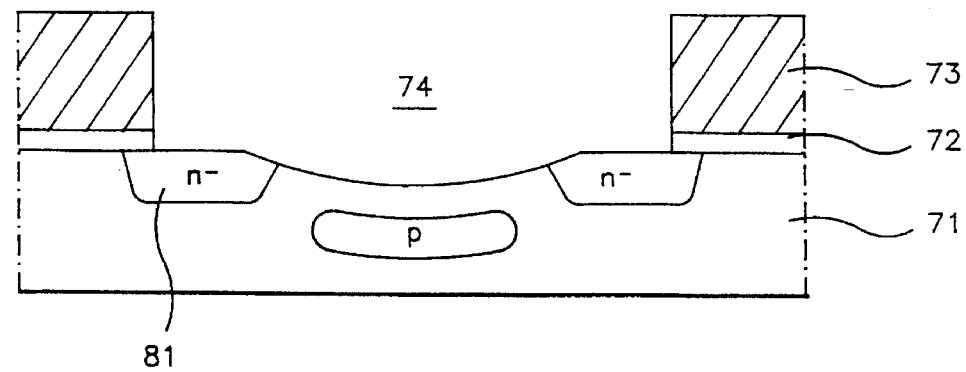

METHOD OF MAKING METAL OXIDE SEMICONDUCTOR TRANSISTORS

CROSS-REFERENCE TO RELATED APPLICATION

This is a divisional of application Ser. No. 08/180,784, filed Jan. 5, 1994, now abandoned.

BACKGROUND OF THE INVENTION

The present invention relates to a metal oxide semiconductor transistor (MOS transistor) capable of applying to minute devices and a method of making the same, and more particularly to an improved MOS transistor and a method of making the same which can improve the characteristic of hot carrier and punch through.

As the technique of making semiconductor devices has been recently developed, the size of the semiconductor devices has been also reduced, thereby enabling the integration degree to be improved.

As the integration degree has been improved, the gate length of MOS transistors should be designed to have a value of from several microns to sub-micron.

If the length of the gate is shortened, the channel length of a MOS transistor is also shortened, thereby causing the effect of hot-carriers to occur.

Since the generated hot-carriers are trapped into a gate oxide film for insulating the gate and thus degrade the reliability of MOS transistor, the effect of hot-carriers has become a serious problem.

To solve the problem caused by the occurrence of hot-carriers, Lightly Doped Drain (LDD) MOS transistors having two kinds of source region and drain region have been proposed. That is, one of the two kinds is a low concentration of source region and drain region.

The other of two kinds is a high concentration of source region and drain region.

FIG. 1 illustrates a sectional view of a conventional LDD MOS transistor.

Referring to FIG. 1, a gate insulation film 12 is formed on a channel region 15 of a p-type silicon substrate 11 and a gate 13 made of a polysilicon film is formed on the gate insulation film 12.

Side wall spacers 14 made of an insulation film are formed at both side walls of the gate and n-type of source region 16 and drain region 17 having a low concentration are formed in the substrate 11 so that they are overlapped with the side wall spacers.

N-type of source region 18 and drain region 19 having a high concentration are formed in the substrate 11, adjacent to the n-type of source region 16 and drain region 17 having a low concentration, respectively.

This LDD MOS transistor can restrain the occurrence of hot-carriers due to the formation of n-type of source region 16 and drain region 17 having a low concentration, but can reduce the ON resistance of MOS transistors due to the parasitic resistance of n-type of source region 16 and drain region 17 having a low concentration.

Since the hot-carriers generated at the surface of the drain region 17 having a high concentration have a energy larger than thermal equilibrium state, the hot-carriers may be trapped in the side wall spacers 14 formed at both side walls of the gate 13.

Therefore, the drain characteristic of MOS transistors becomes degraded.

So as to solve the above-problem of LDD MOS transistors, an inverse T-shaped LDD structure has been proposed.

FIGS. 2a to 2f illustrate a method of making a conventional MOS transistor having an inverse T-shaped LDD.

Referring to FIG. 2a, a conventional field oxidation process is carried out on a p-type of silicon substrate 21 to form two field oxide films 22 for separating an active region 23 from adjacent others.

N-type of impurity ions having a low concentration are implanted into the silicon substrate 21 to form an n-type of impurity diffusion region 24 for a source region and a drain region having a low concentration.

Referring to FIG. 2b, a gate oxide film 25 is grown on an active region 23 of the silicon substrate 21 and a first polysilicon film 26 doped with impurity ions is deposited on the gate oxide film 25.

The impurity ions may be doped into the polysilicon film 26 during the deposition thereof or after the deposition thereof.

Subsequently, a phosphorous silicate glass (PSG) film 27 is deposited by a chemical vapor deposition process and then etched to form an opening 28.

Referring to FIG. 2c, an insulation film such as PSG is deposited and then etched-back to form spacers 29 at the side walls of the PSG film 27 located in the opening 28.

P-type of impurity ions are implanted into the silicon substrate 21 via the opening 28 using the PSG film 27 and spacers 29 as an ion-implantation mask, to form a p-type channel region 30. Therefore, n-type diffusion regions 24 adjacent to both sides of the channel region 30 become a source region and a drain region having a low concentration respectively.

Referring to FIG. 2d, a second polysilicon film 31 is formed to fill the opening 28.

An oxide film 32 is formed on the polysilicon film 31 by performing the thermal oxidation process on the polysilicon film.

Referring to FIG. 2e, the PSG film 27 and spacers 29 are all removed and spacers 33 made of an insulation film such oxide film are then formed at side walls of the second polysilicon film 31.

Accordingly, a portion of the first polysilicon film 26 is exposed.

Referring to FIG. 2f, the exposed portion of the first polysilicon film 26 is removed using the insulation film 32 and the spacers 33 as an etch mask.

Therefore, an inverse T shaped gate 34 is formed as shown in FIG. 2f.

The inverse T-shaped gate 34 is comprised of an upper portion made of the first polysilicon film 26 and a leg portion made of the second polysilicon film 31.

Subsequently, $n^+$-type of impurity ions are implanted, using the gate 34 and the spacers 33 as an ion-implantation mask, to form source and drain regions 35 having a high concentration.

Therefore, a MOS transistor having an LDD structure is obtained.

As above mentioned, this MOS transistor comprises an inverse T-shaped gate 34 including an upper portion made of the first polysilicon film 26 and a leg portion made of the second polysilicon film 31, n-type of source and drain regions 24 which are overlapped with the upper portion 26 and $n^+$-type of source and drain regions 35.

Herein, the above symbol (−) means a low concentration and the symbol (+) means a high concentration.

However, since the above method of making an inverse T shaped LDD MOS transistor carries out the above ion-implantation process over the whole action region to form a source region and a drain region having a low concentration, it is difficult to control the concentration of the channel region.

Since the p-type of channel region is formed under the gate to prevent the punch through, there is a disadvantage in that the threshold voltage is increased due to the back gate bias.

Since the thickness of the gate oxide film is also constant, the drain leakage may be induced due to the gate.

Another LDD MOS transistor called a double-implanted LDD MOS transistor has been proposed to improve the characteristic of punch through.

The double-implanted LDD MOS transistor (DI-LDD MOS transistor) has a structure in which the channel region is not formed under the gate but the p-type region for punch-through stop encloses the source region and drain region having low concentration.

FIGS. 3a to 3c illustrate a method of making a conventional DI-LDD MOS transistor.

Referring to FIG. 3a, a conventional field oxidation process is carried out on p-type of silicon substrate 41, to form a field oxide films 42 for separating an active region 43 from adjacent active regions.

Subsequently, a gate insulation film 44 is formed on the active region 43 of the substrate 41.

Subsequently, a polysilicon film is deposited on the whole surface of the substrate 41 and then patterned to form a gate 45.

N-type impurity ions such as phosphorous having a low concentration and p-type impurity ions such as boron are implanted into the substrate 41 using the gate 45 as an ion-implantation mask, respectively, and then annealed, to form a source region 46 and drain region 47 having low concentration and also a p-type of impurity region 48 for punch-through stop.

At this time, a p-type impurity region 48 is formed with a structure of pocket in which the p-type impurity region 48 encloses the source region 46 and drain region 47.

Referring to FIG. 3b, a CVD oxide film 49 is deposited on the whole surface of the substrate 41.

Referring to FIG. 3c, the CVD oxide film 49 is etched anisotropically to form spacers 50 at the side walls of the gate 45.

$N^+$-type of impurity ions such as phosphorous having a high concentration are implanted using the gate 45 and the spacers 50 as ion-implantation masks and then annealed to form a source region 51 and drain region 52 having a high concentration.

The p-type impurity region 48 is located such a method that it encloses the n-type of source region 46 and drain region 47 at the near location of the channel region.

Accordingly, since the DI-LDD MOS transistor encloses the $n^-$-type of source region 46 and drain region 47, it is possible to reduce the short channel effect and the occurrence of hot carriers.

However, since the gate 45 is not completely overlapped with the $n^-$-type of source region 46 and drain region 47, it is impossible to restrain the occurrence of hot carriers as above mentioned.

Since diffusing the implanted ions with the p-type impurity region 48 for punch-through stop is also formed by an annealing process, there is a limitation in that the p-type of impurity region 48 can not be defined deeply.

SUMMARY OF THE INVENTION

Therefore, an object of the invention is to provide an advanced LDD MOS transistor capable of improving the characteristic of punch-through and reducing the effect of hot carriers and a method of making the same.

In one aspect, so as to achieve the above-object, the present invention provides a MOS transistor comprising:

a silicon substrate having a first conductivity type in which its central portion having a channel region has a recessed surface and other portion excepting the central portion has a flattened surface;

a thin gate oxide film formed on the recessed surface of the silicon substrate;

an oxide film formed on the flattened surface of the silicon substrate and being thicker than the gate oxide film;

a gate formed on the gate oxide film and having a structure in which its upper surface is flattened and its lower surface is convex;

a thick cap oxide film on the gate;

a low concentration source region and drain region having a second conductivity type overlapped completely with the gate and formed on a portion adjacent to the channel region of the recessed surface of the silicon substrate;

a high concentration source region and drain region having the second conductivity type formed on the flattened surface of the silicon substrate and adjacent to the low concentration of source and drain region; and impurity regions formed on the silicon substrate such that they enclose the low concentration source region and drain region.

In another aspect, the present invention also provides a method of making a MOS transistor comprising the steps of:

growing a first oxide film on a silicon substrate;

depositing a thick nitride film on the first oxide film;

etching the nitride film together with the first oxide film to form an opening region;

depositing a thin first polysilicon film thinly on the entire surface of the silicon substrate;

forming sidewall spacers in the opening region to expose a portion of the first polysilicon film formed on the silicon substrate and the first polysilicon film formed on the nitride film excepting the side and bottom of the sidewall spacers;

performing a thermal oxide process to the first polysilicon film exposed on the silicon substrate and the polysilicon film exposed on the nitride film using the sidewall spacers as an oxidization mask to form thick field oxide film and a second oxide film, respectively;

removing the sidewall spacers to expose the remaining first polysilicon film remaining on the bottom and the side of the sidewall spacers;

oxidizing the exposed-remained polysilicon film to form a third oxide film;

implanting a second conductivity type of impurity-ions and a first conductivity type of impurity-ions into the silicon substrate in this order using the thick field oxide film as an ion-implantation mask, to form the second conductivity type of low concentration source region and drain region and the first conductivity type of impurity region enclosing the low concentration source region and drain region;

removing the third oxide film and the field oxide film and the field oxide film such that the silicon substrate can have a recessed surface in the opening region and also removing the second oxide film to expose a nitride film;

forming a fourth oxide film for gate oxide film on the recessed surface of the silicon substrate;

forming a polysilicon film for gate on the fourth oxide film to fill portion of the opening region with the polysilicon film;

forming a thick oxide film on the second polysilicon film and then etching back to fill the opening region completely;

removing the exposed nitride film to expose the first oxide film; and implanting a second conductivity type of impurity-ions into the silicon substrate via the exposed first oxide film using the second polysilicon film as a mask, to form high concentration of source region and drain region.

BRIEF DESCRIPTION OF THE DRAWINGS

FIGS. 4a–4l show a process for making an LDD MOS transistor in accordance with a first embodiment of the present invention.

FIGS. 5a–5l show a method of making an LDD MOS transistor in accordance with a second embodiment of the present invention.

DETAILED DESCRIPTIONS OF THE PREFERRED EMBODIMENTS

Embodiments of the present invention will be hereinafter described in detail referring to attached drawings.

FIGS. 4a to 4l show a process for making an LDD MOS transistor in accordance with a first embodiment of the present invention.

Figure 1:
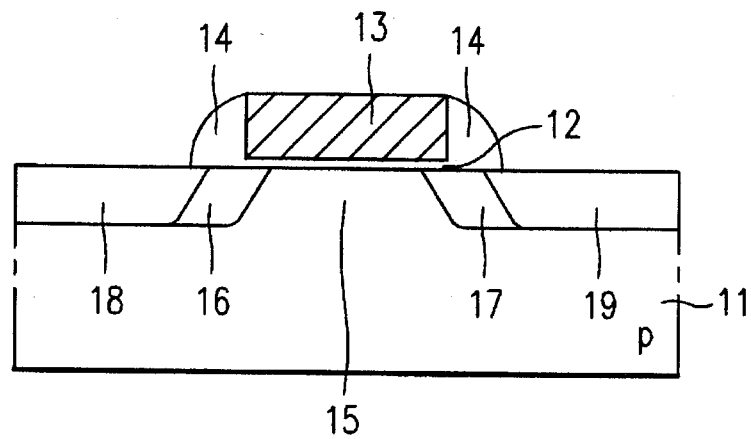
FIG. 1 illustrates a sectional view of a conventional LDD MOS transistor.
Figure 2A:
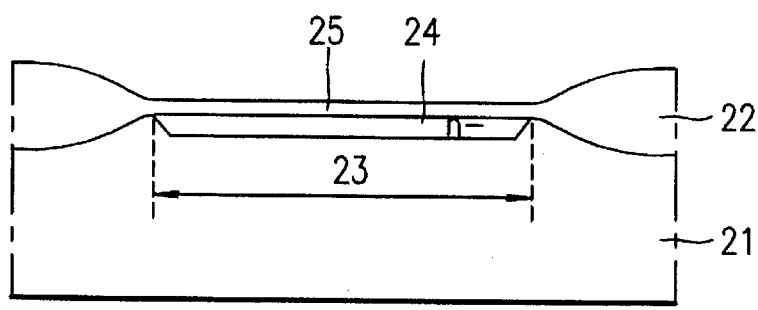
FIGS. 2a–2f illustrate a method of making a conventional MOS transistor having an inverse T-shaped LDD.
Figure 2B:
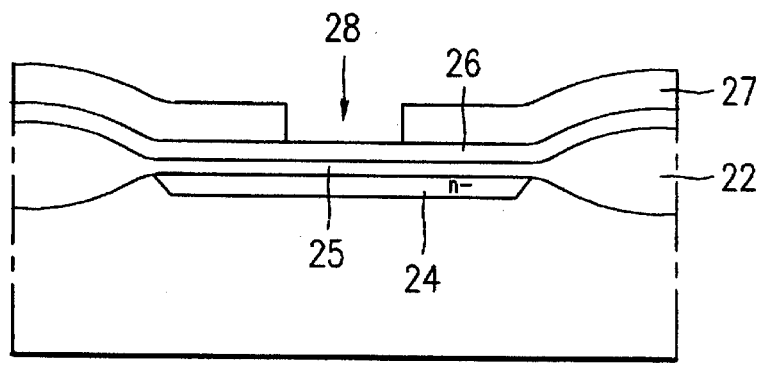
Figure 2C:
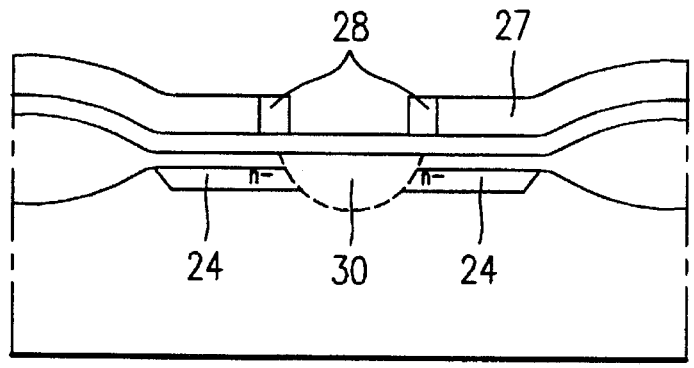
Figure 2D:
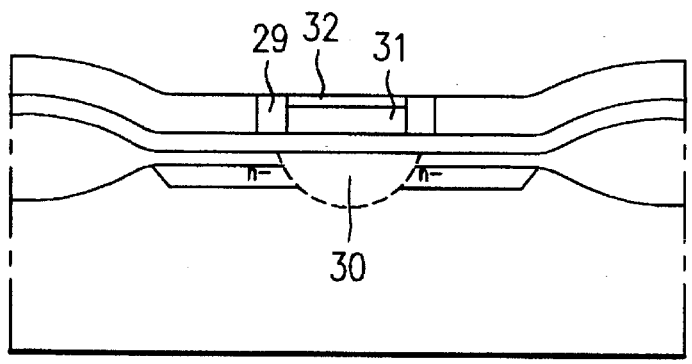
Figure 2E:
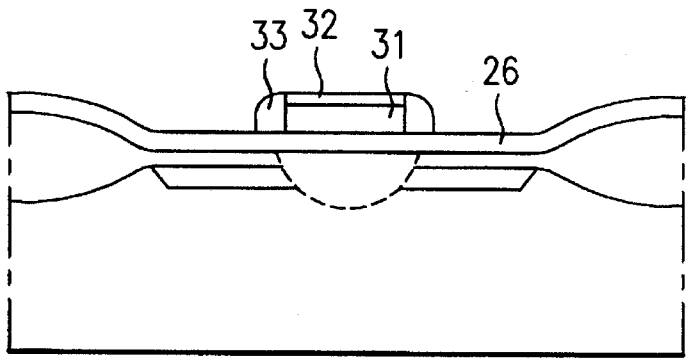
Figure 2F:
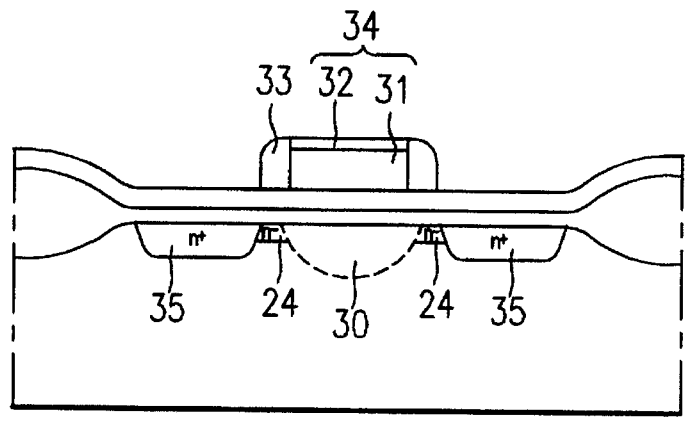
Figure 3A:
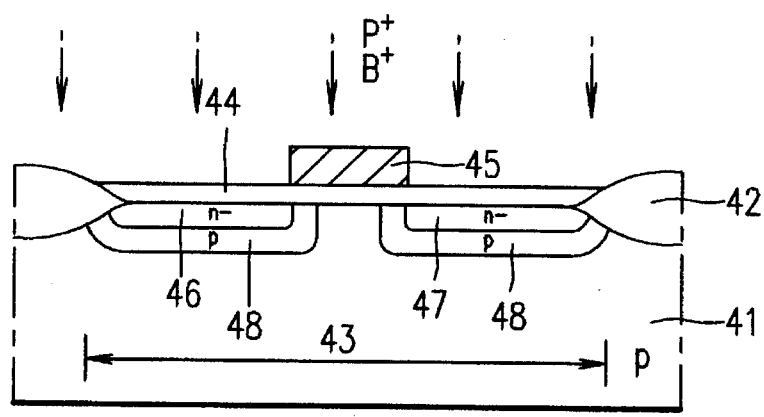
FIGS. 3a–3c illustrate a method of making a conventional DI-LDD MOS transistor.
Figure 3B:
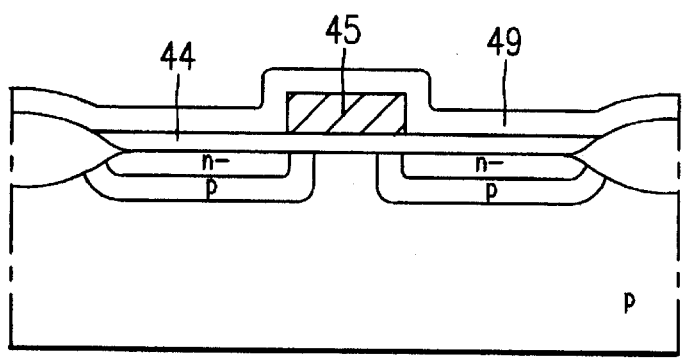
Figure 3C:
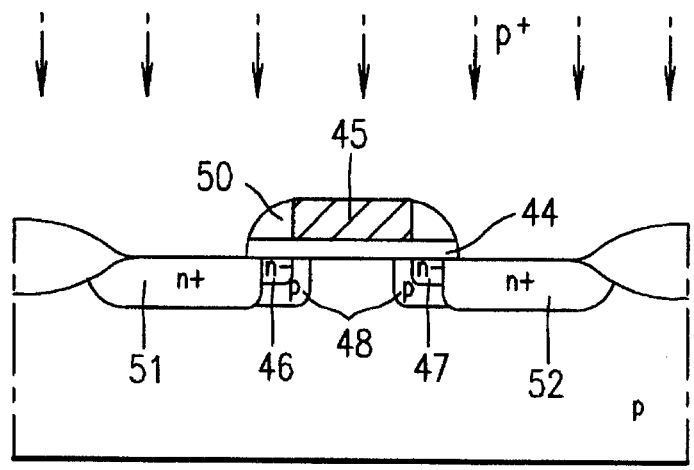
Figure 4A:
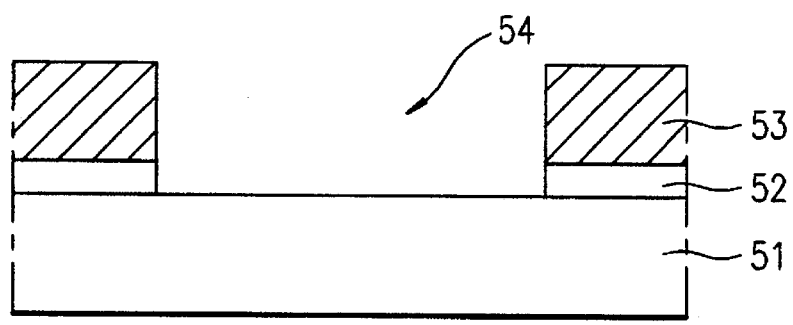

Referring to FIG. 4a, an oxide film 52 is formed on a p-type of semiconductor substrate 51 and a nitride film 53 is then formed on the oxide film 52.

The nitride film 53 and the oxide film 52 are subjected to a photolithography process, to form an opening region 54 at the location in which a gate will be formed.

Figure 4B:
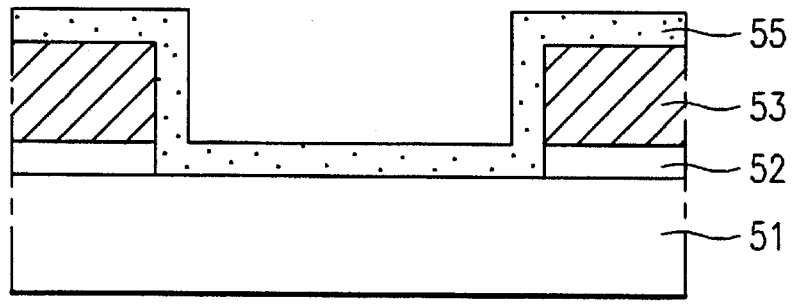

Referring to FIG. 4b, a thin polysilicon film 55 is deposited over the entire surface of the silicon substrate 51.

The polysilicon film 55 is used as a stress buffer, upon performing the field oxidation process.

Figure 4C:
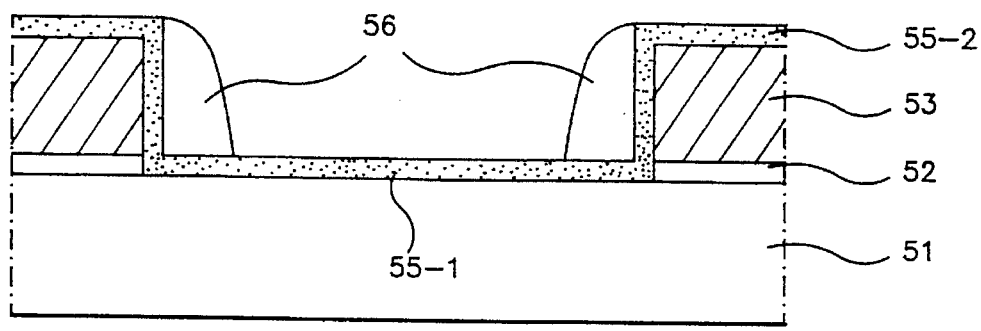

Referring to FIG. 4c, a thick nitride film 56 is deposited on the polysilicon film 55 and then etched by an anisotropic etching method, such as reactive ion etching (RIE), to form side wall spacers 56 at the side walls of opening region 54.

Therefore, a portion of the polysilicon film 55-2 located on the nitride film 53 and a portion of the polysilicon film 55-1 located in the opening region 54 are exposed.

Figure 4D:
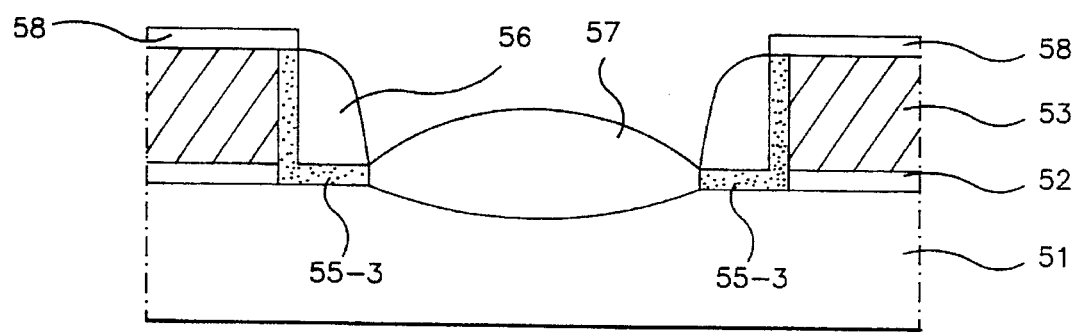

Referring to FIG. 4d, a thermal oxidation process is carried out to oxidize the exposed portion of polysilicon film 55-1, thereby enabling a thick field oxide film 57 to be formed.

At this time, the portion of the polysilicon film 55-2 exposed on the nitride film 53 is also oxidized and becomes an oxide film 58.

At this time, the sidewall spacers 56 made of nitride film serve as an oxidation mask.

The field oxide film 57 serves as a blocking means upon performing the following ion-implantation process.

Therefore, portion of the polysilicon 55-3 film which is formed at the side of the sidewall spacers 56 and under the sidewall spacers is not oxidized due to the sidewall spacers.

Figure 4E:
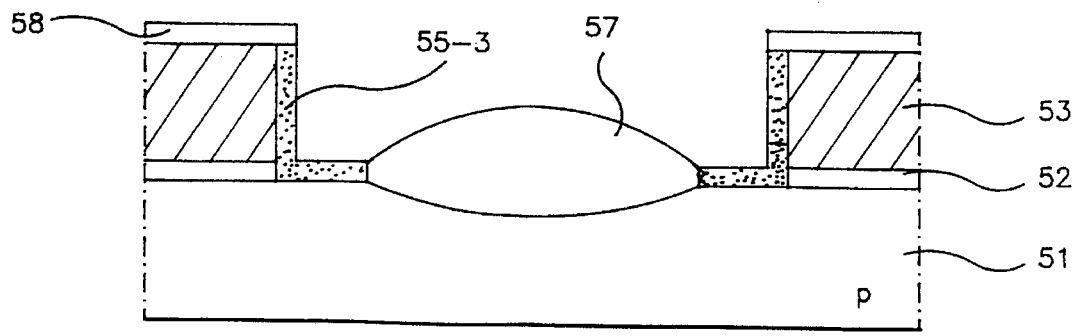

Referring to FIG. 4e, the sidewall spacers 56 for an oxidation mask are removed.

Therefore, the polysilicon film 55-3 which is formed at the side of the sidewall spacers 56 and under the sidewall spacers 56 is exposed.

Figure 4F:
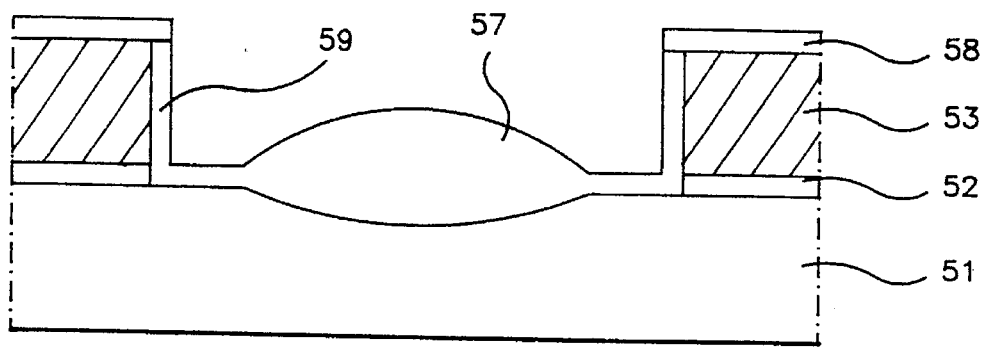

Referring to FIG. 4f, the exposed polysilicon film 55-3 is oxidized to make it into an oxide film 59 so that it can be removed easily by the following process.

Figure 4G:
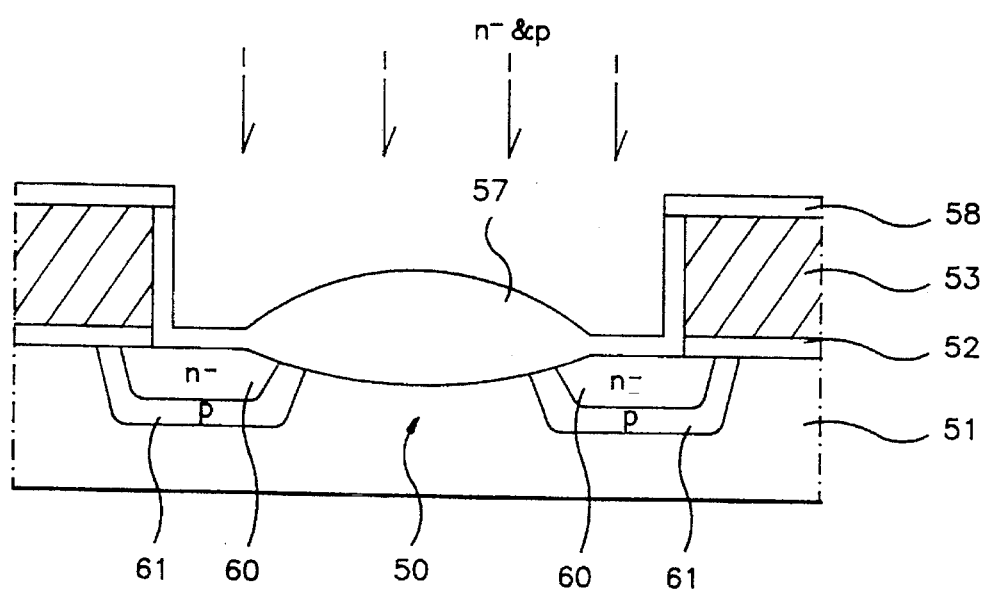

Referring to FIG. 4g, n-type impurity-ions and p-type impurity-ions are implanted respectively using the thick field oxide film 57 as a mask, to form low concentrations of source drain regions 60 and simultaneously p-type impurity region 61 respectively, thereby causing a structure in which the p-type impurity region 61 encloses the source/drain regions 60 to be made.

Due to the formation of the low concentration source/drain regions 60, a channel region 50 is defined in the silicon substrate 51.

Since impurity-ions are implanted using the filed oxide film as an ion-implantation mask to form the low concentration source/drain regions 60, a graded junction is formed.

Figure 4H:
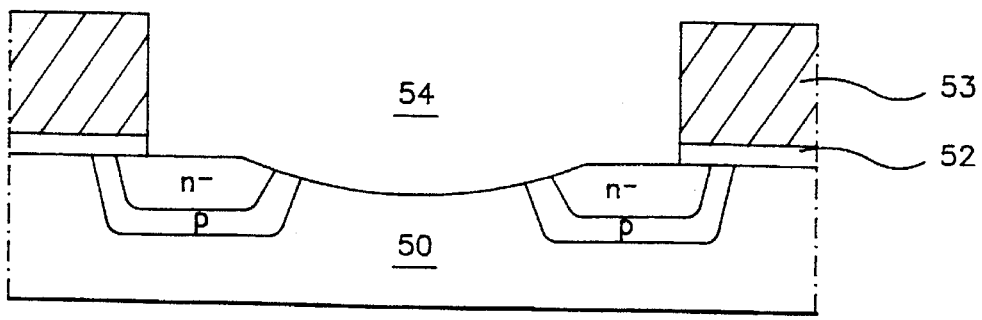

Referring to FIG. 4h, the oxide films 57, 58 and 59 are all removed.

Due to the removal of the field oxide film 57, the substrate 51 has a structure in which the exposed surface in the opening region 54 is recessed.

Figure 4I:
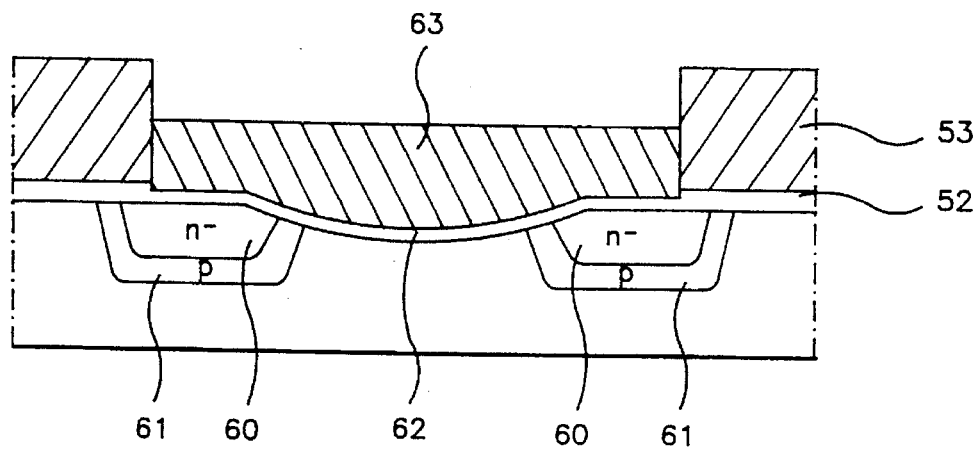

Referring to FIG. 4i, a thin gate oxide film 62 is formed on the exposed substrate 51.

Subsequently, a polysilicon film 63 is deposited with a greater thickness than the oxide film 52 and then etched-back until the polysilicon film 63 for gate partly fills the opening region 54.

Therefore, since the gate made of the polysilicon film 63 is formed on the recessed surface of the silicon substrate 51, its bottom surface has a convex shape.

Figure 4J:
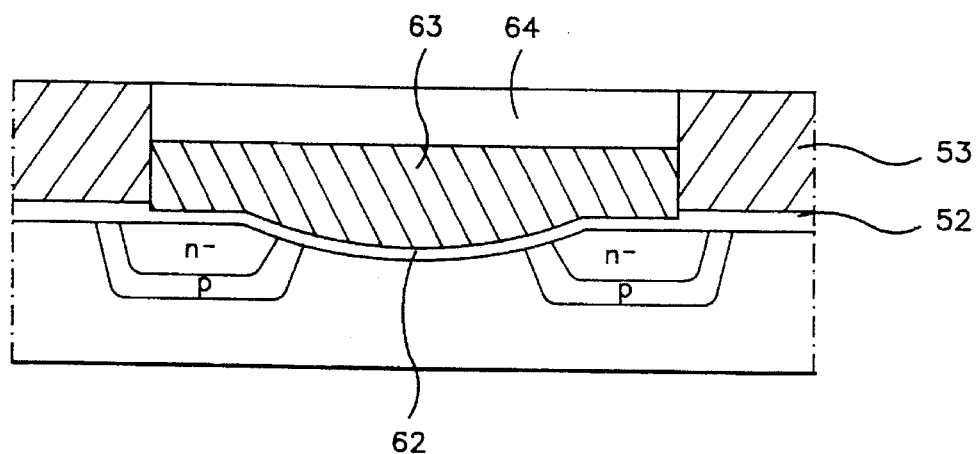

Referring to FIG. 4j, a thick oxide film 64 is deposited and then etched back to flatten the surface of the silicon substrate 51.

Therefore, the oxide film 64 is formed only on the polysilicon film 63, thereby causing the opening region 54 to be completely filled.

At this time, the oxide film 64 serves as the cap oxide film of gate.

Figure 4K:
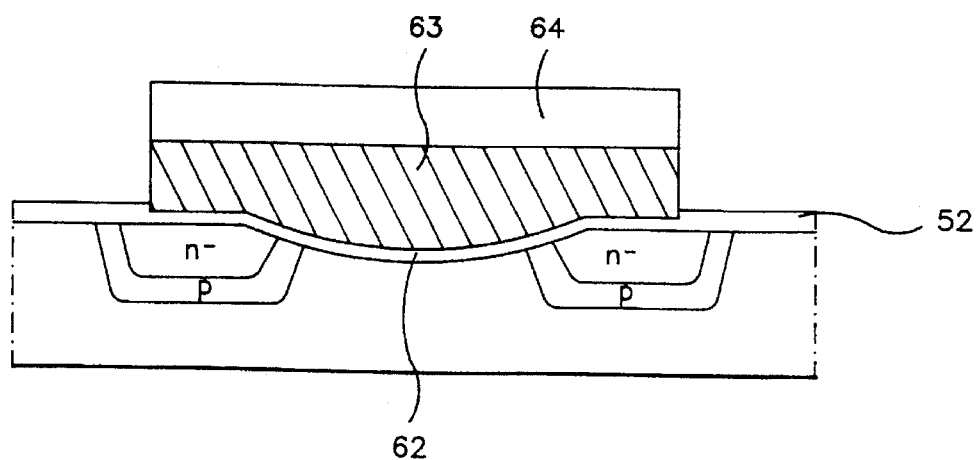
Figure 4I:
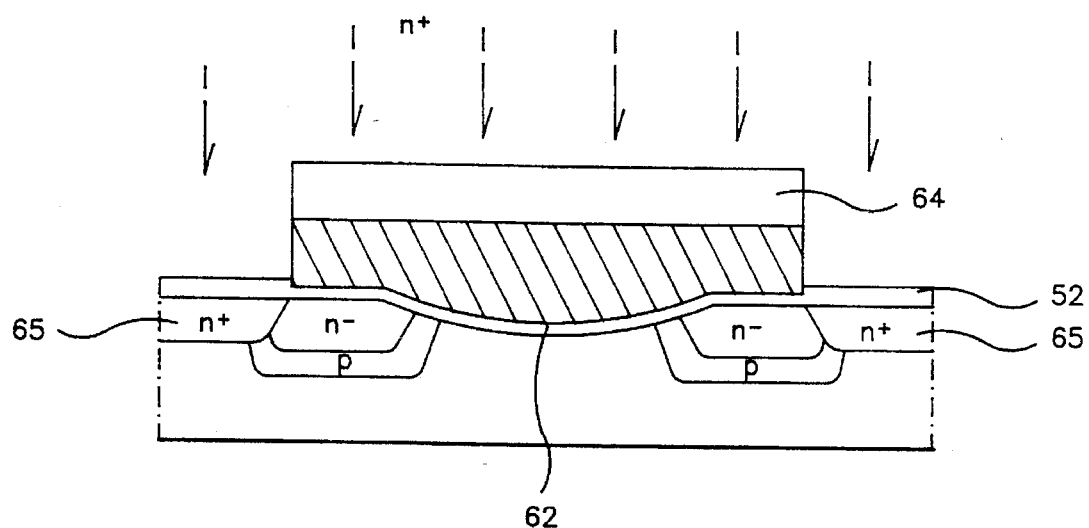

Referring to FIG. 4k, the remaining nitride film 53 is removed to expose the oxide film 52.

Referring to FIG. 4l, n-type impurity-ions are implanted using the polysilicon film 63 for gate as an ion-implantation mask to form high concentration source/drain regions 65.

Accordingly, the gate of completed LDD MOS transistor has a structure in which its upper surface is flat and its bottom surface is convex.

FIGS. 5a to 5l show a method of making a LDD MOS transistor in accordance with a second embodiment of the present invention.

Figure 5A:
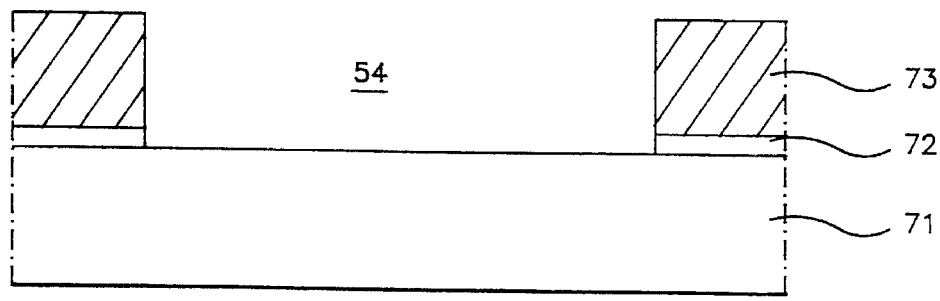

Referring to FIG. 5a, an oxide film 72 is grown on a p-type of silicon substrate 71 and a thick nitride film 73 is then deposited on the oxide film 72.

The nitride film 73 and the oxide film 72 are patterned at a portion in which a gate will be formed, using a photolithography process to form an opening region 74.

Therefore, the silicon substrate 71 is exposed in the opening region 74.

Figure 5B:
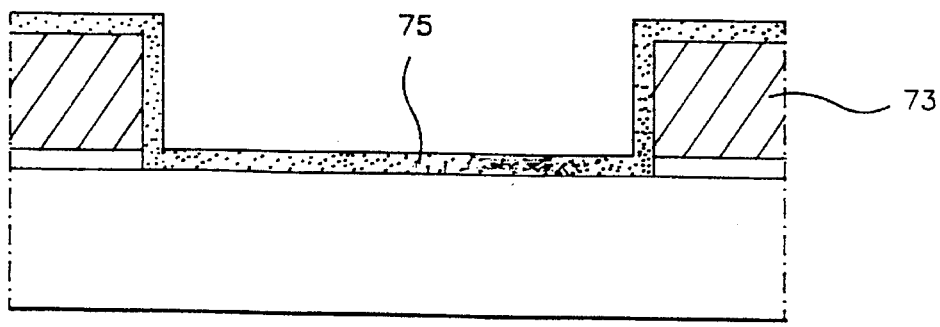
Figure 5C:
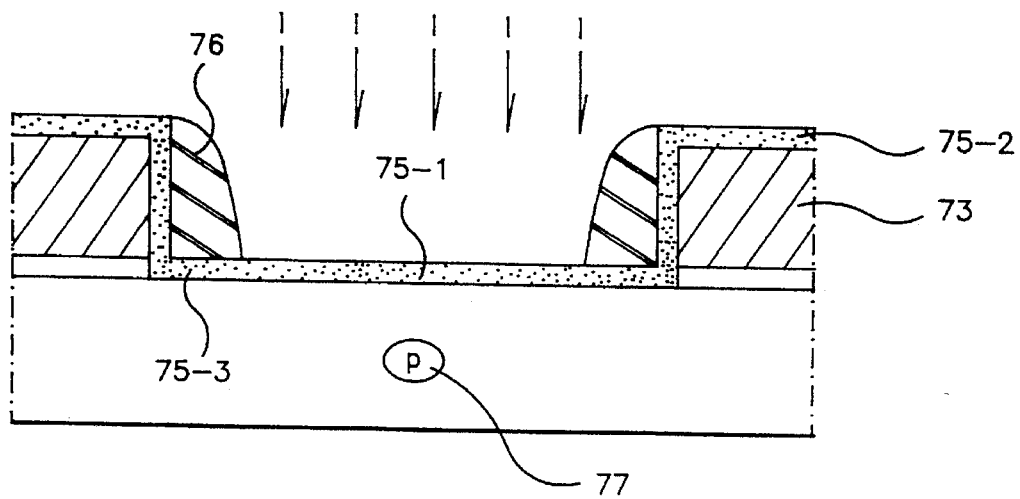

Referring to FIG. 5b, a thin polysilicon film 75 is deposited over the entire surface of the silicon substrate 71.

Therefore, a portion 75-1 of the polysilicon film 75 located in the opening region 74 and a portion 75-2 located on the nitride film 73 are exposed and a portion 75-3 located at the side of and under the sidewall spacers 76 is not exposed.

P-type impurity ions are implanted into the silicon substrate 71 through the opening region 74 using the sidewall spacers 76 as an ion-implantation mask, to form a p-type impurity region 77 for punch through stop in the bulk of the silicon substrate 71.

Figure 5D:
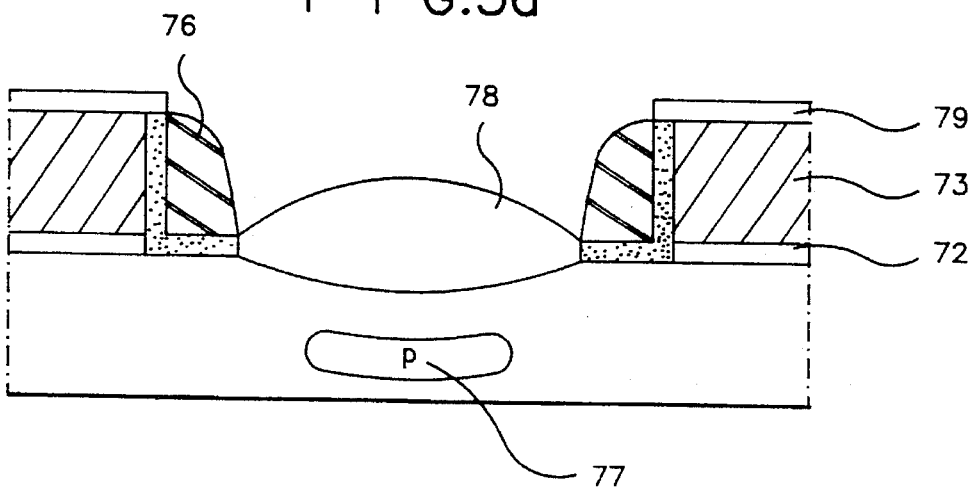

Referring to FIG. 5d, thermal oxidation process is carried out using the sidewall spacers 76 as an oxidation mask to oxidize the portion of the polysilicon film 75-1 located in the opening region 74 and thus to grow a thick field oxide film 78.

The field oxide film 78 serves as a blocking means upon performing the following ion-implantation process.

At this time, the portion of the polysilicon film 75-2 exposed on the nitride film 73 is also oxidized, thereby causing an oxide film 79 to be formed.

The polysilicon film portion 75-3 located at the side of and under the sidewall spacers 76 is not oxidized due to the sidewall spacers 76.

Figure 5E:
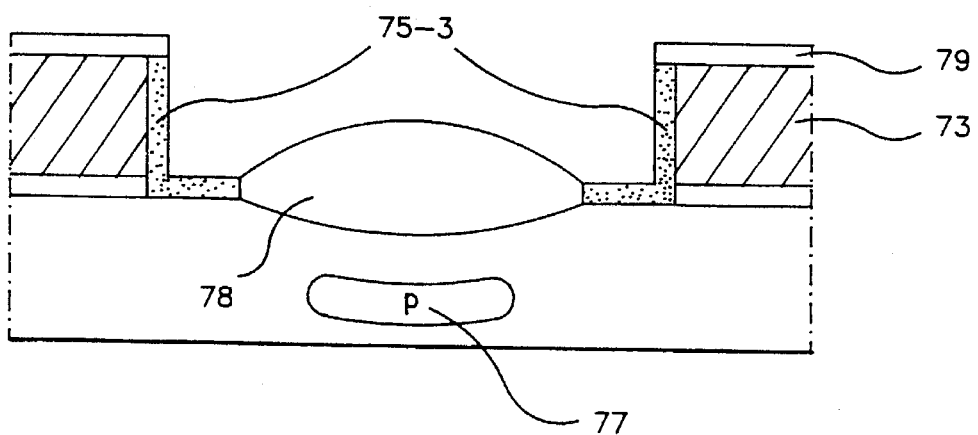

Referring to FIG. 5e, the side wall spacers 76 for oxidation mask are removed.

At this time, the polysilicon film portion 75-3 located at the side of and under the side wall spacers 76 is exposed.

Referring to FIG. 5f, the exposed portion of the polysilicon film 75-3 is oxidized so that it can be easily removed in the following process, thereby causing an oxide film 80 to be formed.

Referring to FIG. 5g, n-type of impurity ions are implanted into the silicon substrate 71 via the opening region 74 using the field oxide film 78 as an ion-implantation mask to form low concentration of n⁻-type source/drain regions 81.

A channel region 70 is defined in the silicon substrate 71 in accordance with the formation of low concentration of source/drain regions 81.

Since ions are implanted using the field oxide film 78 as an ion-implantation mask to form low concentration of source/drain regions 81, a graded junction is formed.

Referring to FIG. 5h, the oxide films 78 to 80 are all removed to expose a portion of the silicon substrate 71 located in the opening region 74.

Therefore, the exposed silicon substrate 71 has a structure in which the surface is recessed in the opening region 74.

Figure 5I:
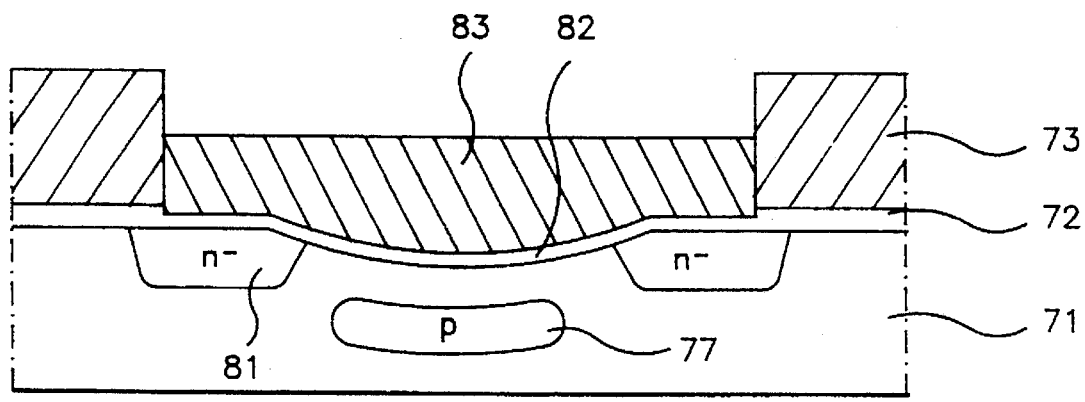

Referring to FIG. 5i, an oxide film 82 is grown on the exposed silicon substrate 71 more thinly than the thickness of the oxide film 72.

A polysilicon film 83 is deposited more thickly than the thickness of the oxide film 72 over the whole surface of the substrate and then etched back to fill the opening region 74 in part.

Therefore, a polysilicon film 83 for gate is formed on the oxide film 82 only in the opening region 74.

Figure 5J:
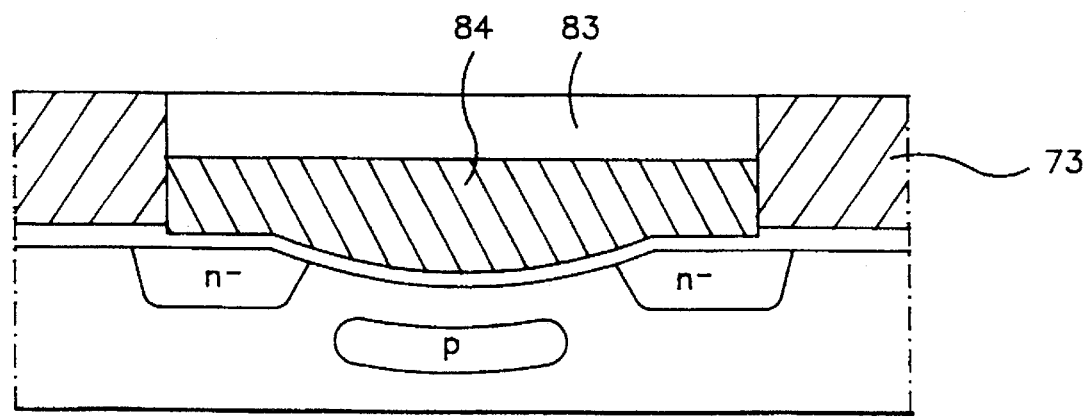

Referring to FIG. 5j, a thick oxide film is grown and then etched back to form a cap oxide film 84. Therefore the opening region 74 is completely filled with the cap oxide film 84, thereby causing the entire surface of the substrate to be flattened.

Figure 5K:
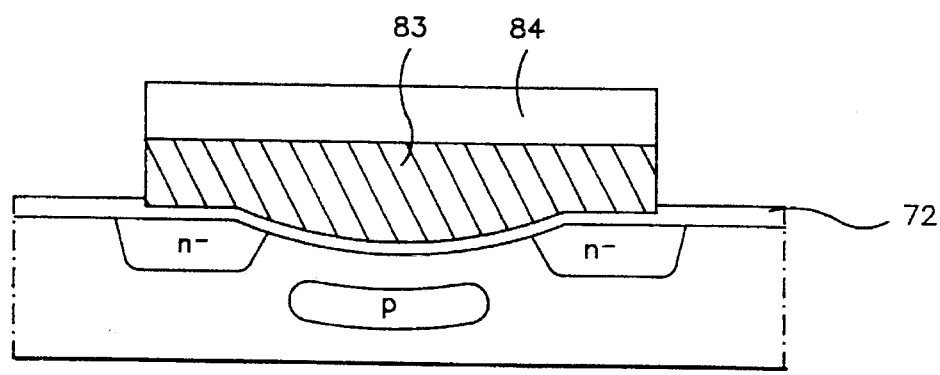

Referring to FIG. 5k, all of the nitride film 73 is all removed to expose the oxide film 72.

Figure 5L:
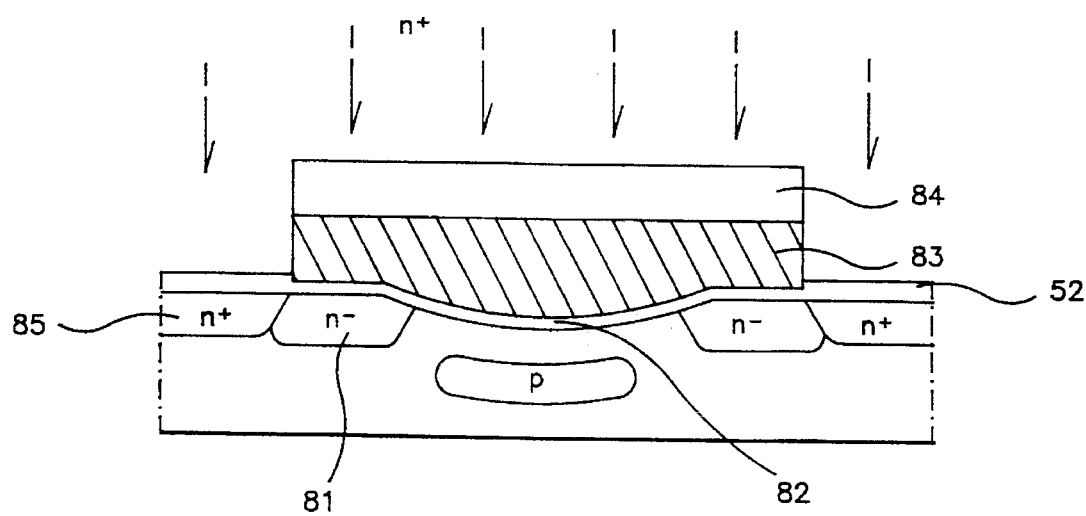

Referring to FIG. 5l, n-type of impurity ions are implanted into the substrate 71 through the exposed oxide film 72 using the polysilicon film 83 for gate and the cap oxide film 84 as an ion-implantation mask, to form a high concentration of n⁺-type source/drain regions 85.

Therefore, a MOS transistor having a LDD structure has a structure a gate 83 is formed at the recessed surface of the silicon substrate 71, low concentration of source/drain regions 81 are formed so that they are completely overlapped with the gate 83 and the p-type of impurity region 77 is formed in the bulk of the silicon substrate 71.

As above mentioned, the following effects can be obtained in accordance with this invention.

First, since the p-type of impurity region for punch-through prevention is formed so that it encloses merely a low concentration of source/drain regions or formed in the bulk of the substrate, it is possible to reduce the junction capacitance of source/drain regions and moreover to improve the operation speed the device.

Second, since the gate is formed on the silicon substrate having a recessed surface, it is possible to improve the characteristic of punch-through.

Since the gate is also formed so that it is completely overlapped with the low concentration of source-drain regions, it is possible for the gate to control the low concentration of source/drain regions and thus to improve the driving power of current.

Third, since impurity ions are implanted using the thick field oxide film as an ion-implantation mask and the low concentration of source/drain regions are thus formed with a graded-shaped junction, it is can be restrained for a high electric field to be formed at the location near to the drain region and it is thus possible to restrain the occurrence of hot-carriers.

Fourth, the thickness of the insulation film formed on the low concentration of source/drain regions is thicker than that of the gate insulation film, it is possible to reduce the drain leakage current induced by the gate.

Fifth, the opening region is formed at the region in which the gate will be formed and the gate made of polysilicon film is then formed on the opening region, it is possible to overcome the limitation of present photolithography techniques to the actual channel length and thus to embody the miniaturization of semiconductor device.

What is claimed is:

1. A method of making metal oxide semiconductor transistor comprising the steps of:

growing a first oxide film on a silicon substrate having a first conductivity type;

depositing a nitride film thickly on the first oxide film;

etching the nitride film together with the first oxide film to form an opening region;

depositing a first polysilicon film thinly on the whole surface of the silicon substrate;

forming sidewall spacers in the opening region to expose a portion of the first polysilicon film formed on the silicon substrate and the first polysilicon film formed on the nitride film;

performing a thermal oxidation process to the first polysilicon film exposed on the silicon substrate and the polysilicon film exposed on the nitride film using the sidewall spacers as an oxidation mask to form a thick field oxide film and a thin second oxide film, respectively;

removing the sidewall spacers to expose the remaining first polysilicon film covered by the sidewall spacers;

oxidizing said remaining first polysilicon film to form a third oxide film;

implanting a second conductivity type of impurity-ions and a first conductivity type of impurity ions into the silicon substrate in this order using the thick field oxide film as an ion-implantation mask, to form the second conductivity type low concentration source region and drain region and the first conductivity type impurity region enclosing the low concentration source region and drain region;

removing the third oxide film and the field oxide film such that the silicon substrate has a recessed surface in the opening region and also removing the second oxide film to expose the nitride film;

forming a fourth oxide film for a gate oxide film on the recessed surface of the silicon substrate;

forming a polysilicon film for a gate electrode on the fourth oxide film to fill a portion of the opening region with the polysilicon film;

forming a thick oxide film on the second polysilicon film and then etching back to fill the opening region completely;

removing the exposed nitride film to expose the first oxide film; and implanting a second conductivity type of impurity-ions into the silicon substrate via the exposed first oxide film using the second polysilicon film as a mask, to form a high concentration source region and drain region.

2. A method of making a metal oxide semiconductor transistor in accordance with claim 1, wherein upon implanting impurity ions for the low concentration source region and drain region, the field oxide film and the nitride film is used as an ion-implantation mask.

3. A method of making a metal oxide semiconductor transistor in accordance with claim 1, wherein upon performing the field-oxidation process, the sidewall spacers serve as the oxidation mask.

4. A method of making a metal oxide semiconductor transistor in accordance with claim 3, wherein the sidewall spacers are made of a nitride film.

5. A method of making a metal oxide semiconductor transistor in accordance with claim 1, wherein upon performing the field-oxidation process, the polysilicon film remaining on the bottom and the side of the sidewall spacers serves as a stress buffer layer.

6. A method of making a metal oxide semiconductor transistor in accordance with claim 1, wherein the first oxide film is formed more thickly than the fourth oxide film.

7. A method of making a metal oxide semiconductor transistor comprising the steps of:

growing a first oxide film on a silicon substrate having a first conductivity type;

depositing a nitride film thickly on the first oxide film;

etching the nitride film together with the first oxide film to form an opening region;

depositing a first polysilicon film thinly on the whole surface of the silicon substrate;

forming sidewall spacers in the opening region to expose a portion of the first polysilicon film formed on the silicon substrate and the first polysilicon film formed on the nitride film;

implanting the first conductivity type of impurity-ions into the silicon substrate via the opening region to form an impurity region having a first conductivity type;

performing a thermal oxidation process to the first polysilicon film exposed on the silicon substrate and the first polysilicon film exposed on the nitride film to form a thick field oxide film and a second thin oxide film, respectively;

removing the sidewall spacers to expose the remaining portion of the first polysilicon film;

oxidizing the remaining portion of the first polysilicon film to form a third oxide film;

implanting second conductivity type of impurity-ions into the silicon substrate to form a low concentration source region and a drain region;

removing the third oxide film and the field oxide film such that the silicon substrate has a recessed surface in the opening region and also removing the second oxide film to expose the nitride film;

forming a fourth oxide film for a gate oxide film on the recessed surface of silicon substrate with a thinner thickness than that of the first oxide film;

forming and then etching back a polysilicon film for a gate electrode on the fourth oxide film to fill a portion of the opening region with the polysilicon film;

forming a thick fifth oxide film on the second polysilicon film to fill the opening region completely;

removing the exposed nitride film to expose the first oxide film; and implanting the second conductivity type of impurity-ions into the silicon substrate via the exposed first oxide film using the second polysilicon film as a mask, to form a high concentration source region and drain region.

* * * * *

UNITED STATES PATENT AND TRADEMARK OFFICE
CERTIFICATE OF CORRECTION

PATENT NO. : 5,552,329
DATED : September 3, 1996
INVENTOR(S) : Kyung S. KIM, et al It is certified that error appears in the above-indentified patent and that said Letters Patent is hereby corrected as shown below:

On title page,

Item [73] Assignee: "LG Semicon Co., Ltd., Tokyo, Japan"

should read --LG Semicon Co., Ltd., Seoul, Rep. of Korea--.

Signed and Sealed this

Twenty-fourth Day of March, 1998

Attest:

BRUCE LEHMAN

*Attesting Officer*  *Commissioner of Patents and Trademarks*